(12) United States Patent
Yamano

(10) Patent No.: US 8,415,796 B2
(45) Date of Patent: Apr. 9, 2013

(54) SEMICONDUCTOR DEVICE HAVING A MULTILAYER STRUCTURE

(75) Inventor: Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 54 days.

(21) Appl. No.: 13/117,326

(22) Filed: May 27, 2011

(65) Prior Publication Data

US 2011/0309498 A1    Dec. 22, 2011

(30) Foreign Application Priority Data

Jun. 21, 2010  (JP) ................................ 2010-140940

(51) Int. Cl.
   *H01L 23/495*   (2006.01)
(52) U.S. Cl. ......... 257/737; 257/E23.021; 257/E23.168; 257/738; 257/778; 257/734; 257/774; 257/773; 257/784; 257/750
(58) Field of Classification Search .................. 257/737, 257/E23.021, 738, 778, 734, 750, E23.168, 257/774, 773, 784
   See application file for complete search history.

(56) References Cited

U.S. PATENT DOCUMENTS

| | | | | |
|---|---|---|---|---|
| 7,579,690 | B2 * | 8/2009 | Chia ............................. | 257/723 |
| 8,120,166 | B2 * | 2/2012 | Koizumi et al. ............... | 257/697 |
| 2006/0043549 | A1 * | 3/2006 | Hsu ............................... | 257/678 |
| 2006/0163722 | A1 * | 7/2006 | Hsu ............................... | 257/737 |
| 2006/0273463 | A1 * | 12/2006 | Wakabayashi et al. ........ | 257/773 |
| 2008/0315414 | A1 | 12/2008 | Yamano | |
| 2009/0056987 | A1 * | 3/2009 | Nomiya et al. ................ | 174/255 |
| 2009/0302471 | A1 | 12/2009 | Yamano | |
| 2010/0314254 | A1 * | 12/2010 | Kodani ........................... | 205/78 |
| 2010/0319966 | A1 * | 12/2010 | Liu ................................. | 174/255 |
| 2011/0074025 | A1 * | 3/2011 | Yanase et al. .................. | 257/737 |
| 2011/0097850 | A1 * | 4/2011 | Hsu ................................ | 438/113 |
| 2011/0100700 | A1 * | 5/2011 | Kariya et al. .................. | 174/267 |
| 2011/0147927 | A1 * | 6/2011 | Hagihara ....................... | 257/737 |
| 2011/0169164 | A1 * | 7/2011 | Nakamura et al. ............. | 257/739 |
| 2011/0176286 | A1 * | 7/2011 | Nakajima et al. .............. | 361/783 |
| 2011/0244636 | A1 * | 10/2011 | Kondo ........................... | 438/127 |
| 2011/0297425 | A1 * | 12/2011 | Nakamura et al. ............. | 174/251 |

FOREIGN PATENT DOCUMENTS

| | | |
|---|---|---|
| JP | 2002-43753 | 2/2002 |
| JP | 4121542 B1 | 5/2008 |
| JP | 4431628 B1 | 12/2009 |

* cited by examiner

*Primary Examiner* — A O Williams
(74) *Attorney, Agent, or Firm* — Kratz, Quintos & Hanson, LLP

(57) ABSTRACT

A semiconductor device includes a semiconductor substrate including a bump electrode, a first insulating layer formed on the semiconductor substrate and arranged to a lateral direction of the bump electrode, a first wiring layer formed on the first insulating layer and connected to the bump electrode, a second insulating layer formed on the first wiring layer, a via hole formed in the second insulating layer, and reaching the first wiring layer, a second wiring layer formed on the second insulating layer and connected to the first wiring layer via a via conductor formed in the via hole, and an external connection terminal connected to the second wiring layer, wherein an elastic modulus of the second insulating layer is set lower than an elastic modulus of the first insulating layer.

7 Claims, 15 Drawing Sheets

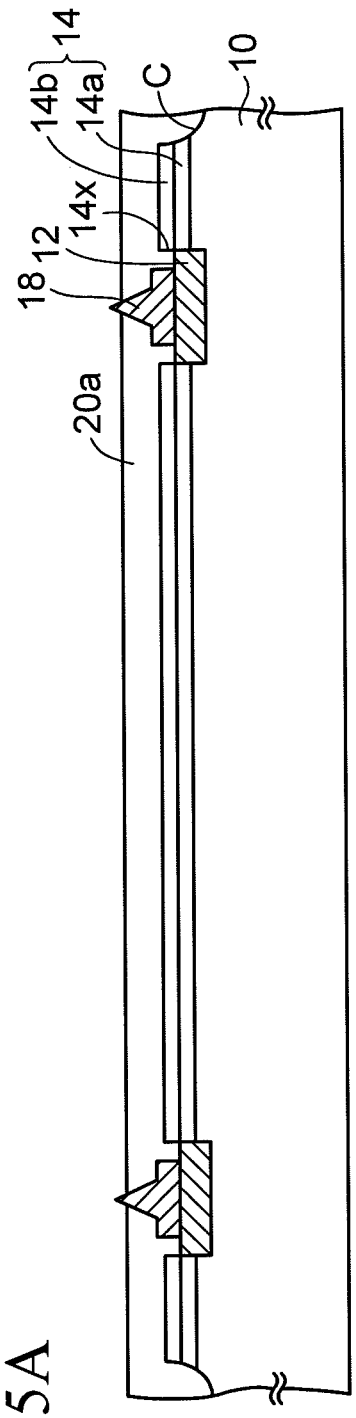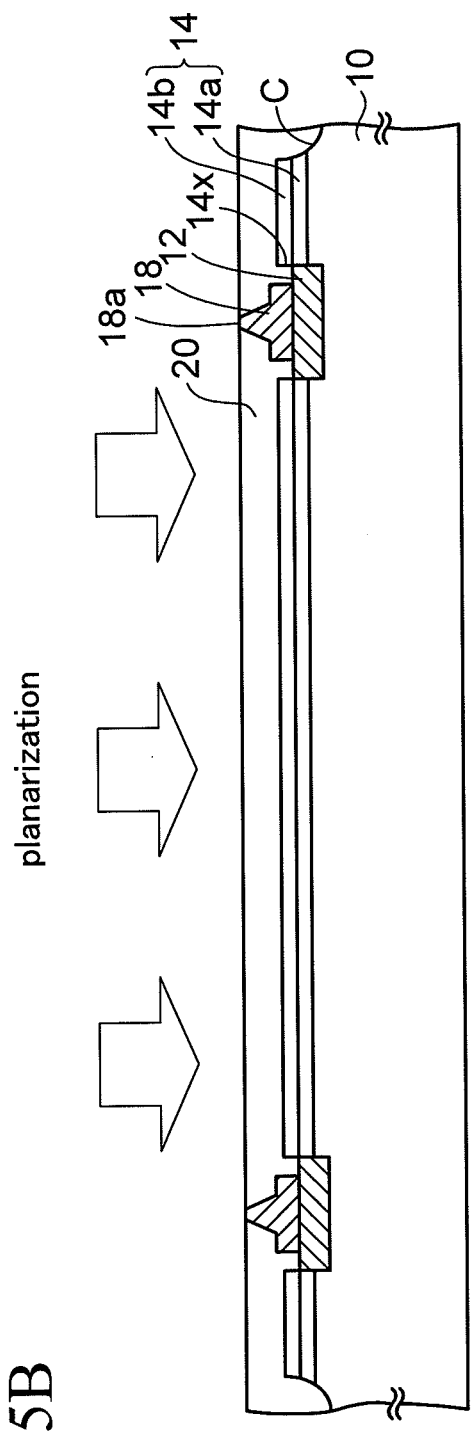

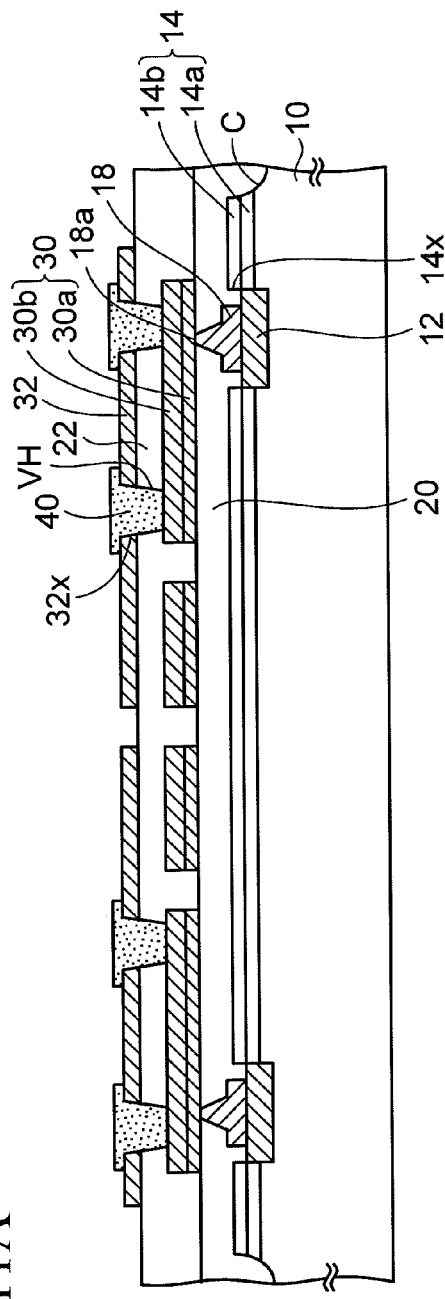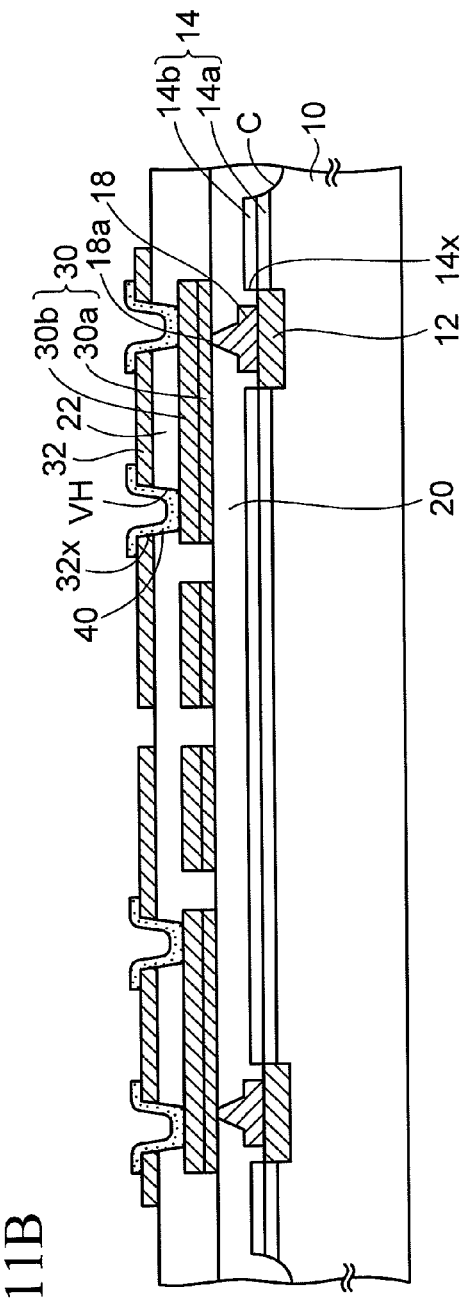
FIG. 11A
FIG. 11B

SEMICONDUCTOR DEVICE HAVING A MULTILAYER STRUCTURE

CROSS-REFERENCE TO RELATED APPLICATIONS

This application is based upon and claims the benefit of priority of the prior Japanese Patent Application No. 2010-140940, filed on Jun. 21, 2010, the entire contents of which are incorporated herein by reference.

FIELD

It is related to a semiconductor device.

BACKGROUND

Recently, with the high performance of the multimedia equipment, etc., the high density in the mounting technology serving as the interface between LSI and the electronic equipment is proceeding.

As the IC package responding to such request, there is the CSP (Chip Size Package) which is packaged in substantially equal size to the chip size. Further, the wafer level CSP from which individual CSPs are obtained by applying the film formation, the processing, etc. associated with the CSP structure in a wafer level, and then dicing such wafer, is known.

In the wafer level CSP, the rewiring is formed to be connected to the connection pads of the silicon wafer in which the transistors are formed, and then the bump electrodes are formed on the rewiring.

In Patent Literature 1 (Japanese Patent No. 4121542) and Patent Literature 2 (Japanese Patent No. 4431628), it is set forth that an insulating layer is formed on a semiconductor substrate having bump electrodes such that upper parts of the bump electrodes are exposed, and then wiring patterns connected to the bump electrodes are formed.

In Patent Literature 3 (Japanese Laid-Open Patent Publication No. 2002-43753), it is set forth that an insulating resin layer and a copper foil are laminated on the inner layer wiring plate, then openings are formed in the copper foil, then non-penetration holes are formed in the insulating resin layer through the opening in the copper foil by the blasting process, and then conductor circuit patterns are formed in the non-penetration holes by the plating.

In the semiconductor device having the CSP structure in the prior art, in most cases the rewiring formed on the silicon wafer is formed as a single layer, and therefore employment of the multilayer wiring structure is not considered at all (for example, Patent Literatures 1 and 2). In particular, in the semiconductor devices such as ASI, Logic, etc., it is required that the rewiring having the multilayer structure should be formed in order to correspond to the multi-pin type.

Further, in the prior art, the reliability in mounting the semiconductor device onto the mounting substrate is not considered. Therefore, such a problem exists that the conduction failure is caused due to the fact that a stress is concentrated in the external connection terminals of the semiconductor device at a time of mounting.

SUMMARY

According to one aspect discussed herein, there is provided a semiconductor device includes a semiconductor substrate including a bump electrode, a first insulating layer formed on the semiconductor substrate, and arranged to a lateral direction of the bump electrode, a first wiring layer formed on the first insulating layer, and connected to the bump electrode, a second insulating layer formed on the first wiring layer, a via hole formed in the second insulating layer, and reaching the first wiring layer, a second wiring layer formed on the second insulating layer, and connected to the first wiring layer via a via conductor formed in the via hole, and an external connection terminal connected to the second wiring layer, wherein an elastic modulus of the second insulating layer is set lower than an elastic modulus of the first insulating layer.

BRIEF DESCRIPTION OF THE DRAWINGS

FIGS. 5A and 5B are sectional views (#5) depicting the method of manufacturing the semiconductor device according to the embodiment;

FIGS. 11A and 11B are sectional views (#11) depicting the method of manufacturing the semiconductor device according to the embodiment;

DESCRIPTION OF EMBODIMENT

An embodiment of the present invention will be explained with reference to the accompanying drawings hereinafter.

Figure 13:
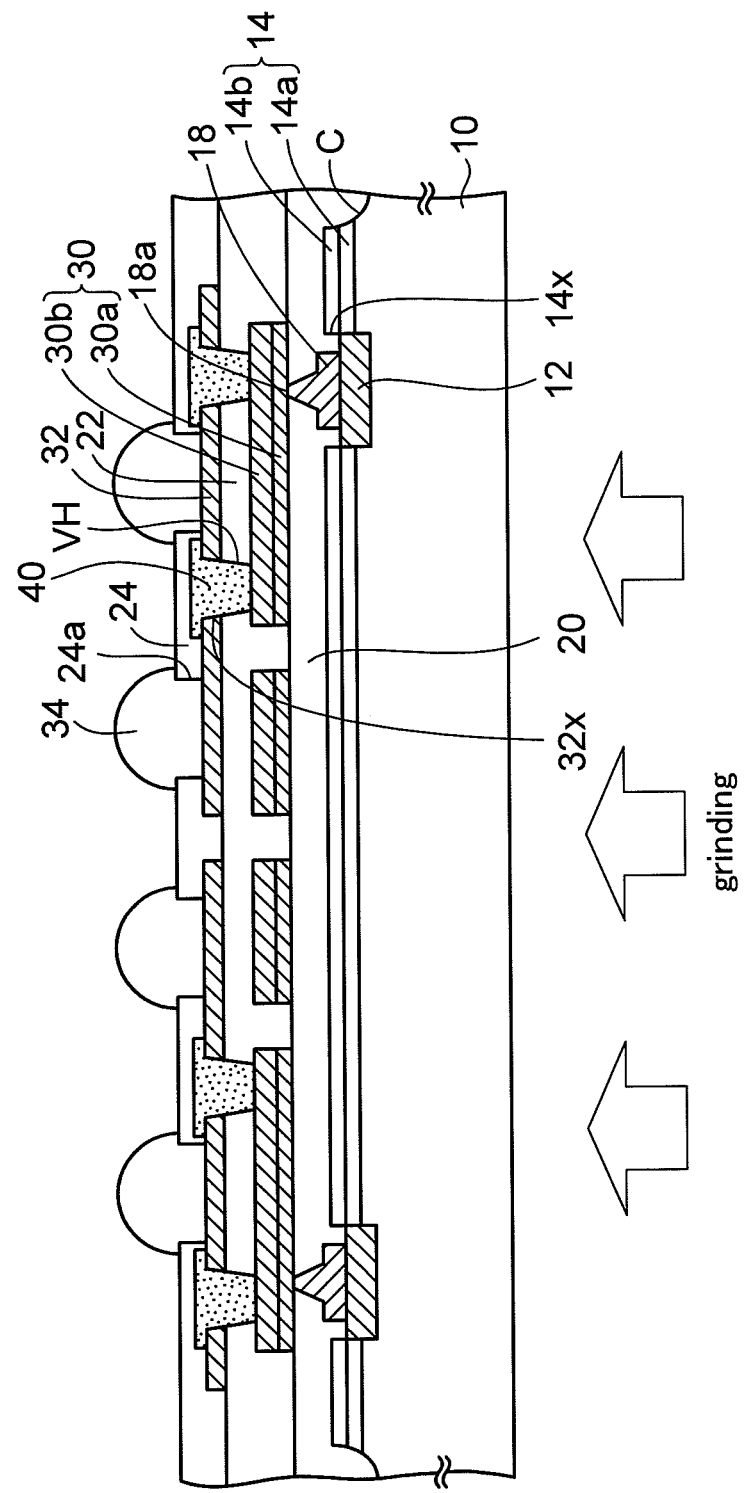
FIG. 13 is a sectional view (#13) depicting the method of manufacturing the semiconductor device according to the embodiment.
Figure 14:
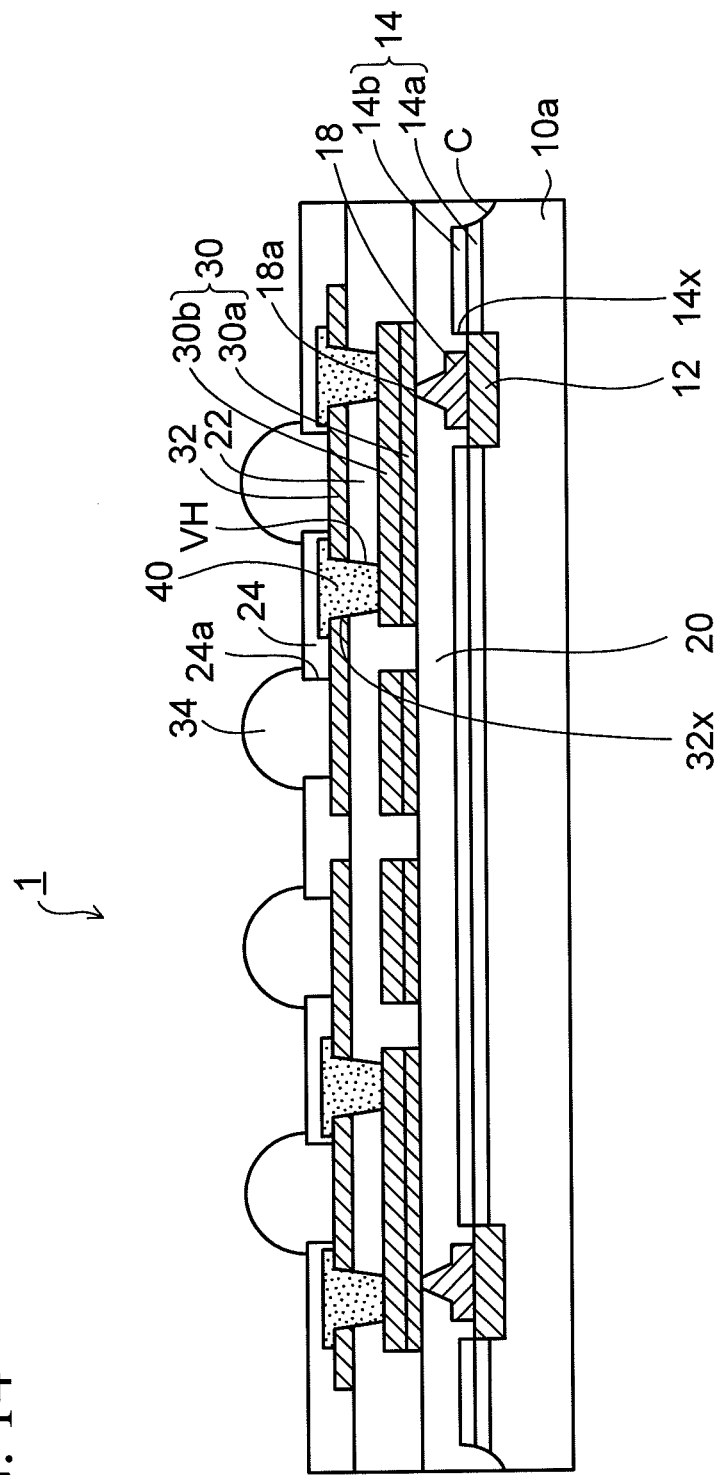
FIG. 14 is a sectional view depicting a semiconductor device according to the embodiment.

FIG. 1 to FIG. 13 are sectional views depicting a method of manufacturing a semiconductor device according to an embodiment, and FIG. 14 is a sectional view depicting a semiconductor device according to the embodiment.

Figure 1:
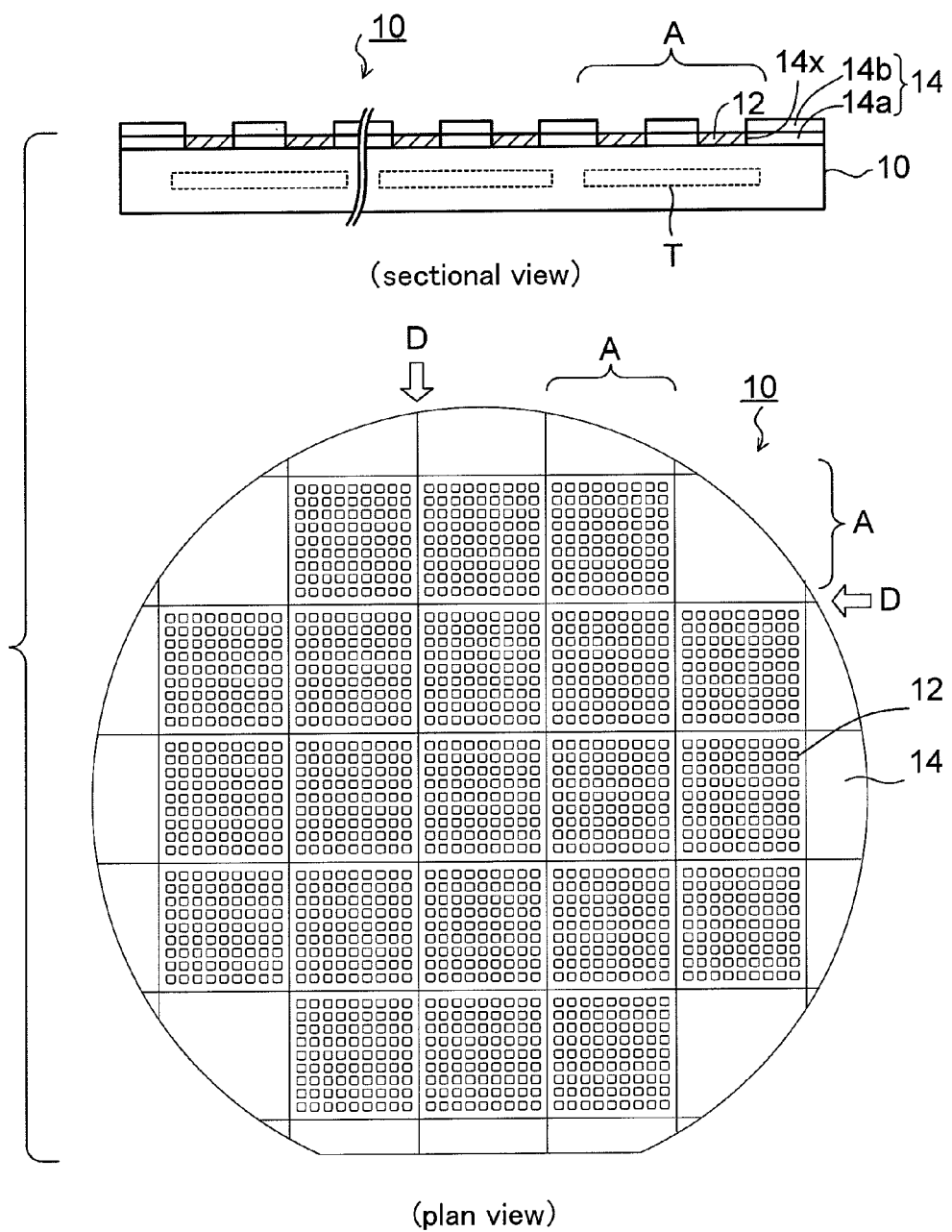
FIG. 1 is a sectional view and plan view (#1) depicting a method of manufacturing a semiconductor device according to an embodiment.

In the method of manufacturing the semiconductor device according to the embodiment, first, a silicon wafer 10 as depicted in FIG. 1 is prepared. In the present embodiment, the silicon wafer 10 is illustrated as a semiconductor wafer.

The silicon wafer 10 includes connection pads 12 and a passivation layer 14 (protection insulating layer) in which opening portions 14x which expose the connection pads 12 are provided, to the uppermost part thereof.

The connection pad 12 is formed of aluminum, aluminum alloy, or the like, and the passivation layer 14 is constructed by forming a silicon nitride layer 14a and a polyimide resin layer 14b sequentially from the bottom. In this case, the passivation layer 14 may be formed of the silicon nitride layer 14a by omitting the polyimide resin layer 14b.

A plurality of element forming areas T in each of which circuit elements such as transistor (semiconductor element), capacitor, resistor, and the like are formed are provided in the silicon wafer 10. A multilayer wiring (not shown) for connecting various circuit elements is formed on each element forming area T, and the multilayer wiring is connected to the connection pads 12.

To explain further by reference to a plan view of FIG. 1, a large number of chip areas A each of which contains the element forming area T are provided in the silicon wafer 10. The chip area A is surrounded by dicing lines D which are arranged in a grid-like fashion, and is defined.

In the example in the plan view of FIG. 1, the connection pads 12 are arranged as the area-array type, and are arranged in a grid-like fashion in the whole area of each chip area A. Otherwise, the connection pads 12 may be arranged as the peripheral type, and may be arranged on the peripheral part of each chip area A respectively. The silicon wafer 10 becomes individual semiconductor chips (semiconductor devices) by dicing the silicon wafer 10 along the dicing lines D so as to obtain respective chip areas A.

In following steps, while partially referring to one chip area A of the silicon wafer 10 in FIG. 1, explanation will be made hereunder.

Figure 2A:
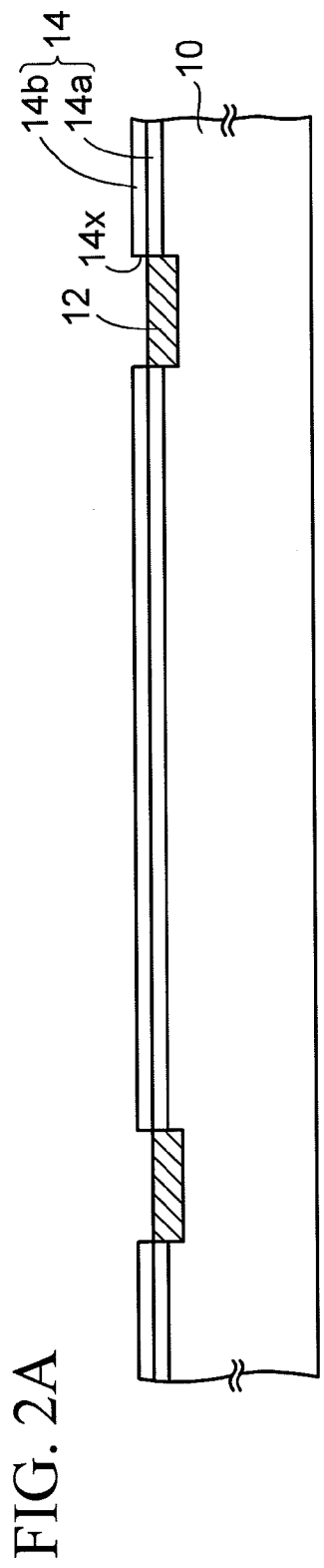
FIGS. 2A and 2B are sectional views (#2) depicting the method of manufacturing the semiconductor device according to the embodiment.

As depicted in FIG. 2A, the silicon wafer 10 explained in FIG. 1 is prepared. A thickness of the silicon wafer 10 is about 600 to 800 μm.

Figure 2B:
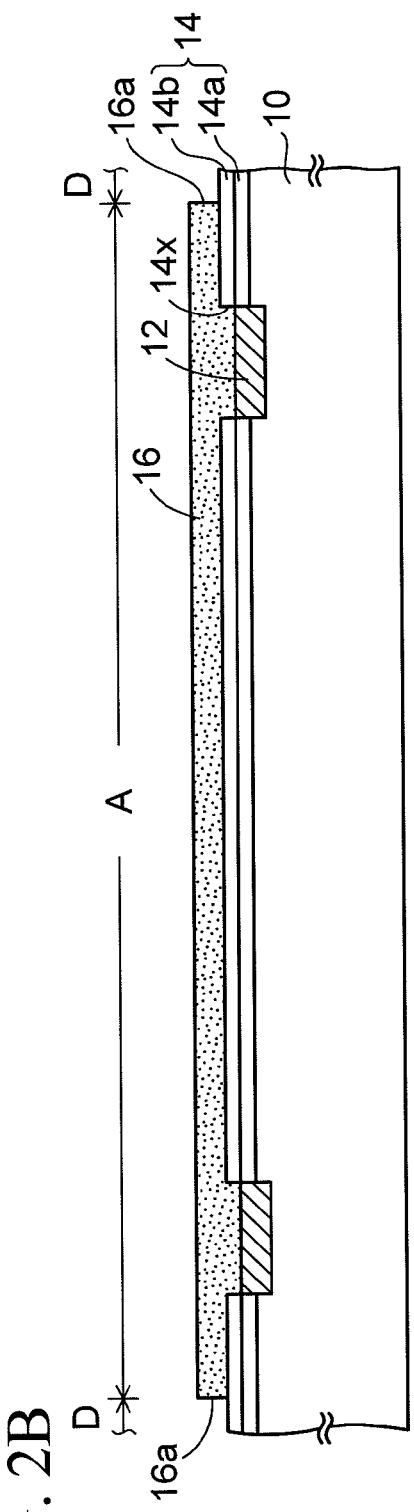

Then, as depicted in FIG. 2B, a dry film resist 16 of about 50 μm thickness is pasted onto the silicon wafer 10, and then is exposed/developed based on the photolithography, and thus the dry film resist 16 is patterned. Accordingly, the dry film resist 16 is left on each chip area A, and an opening portion 16a of the dry film resist 16 is arranged on the dicing lines D.

Figure 3A:
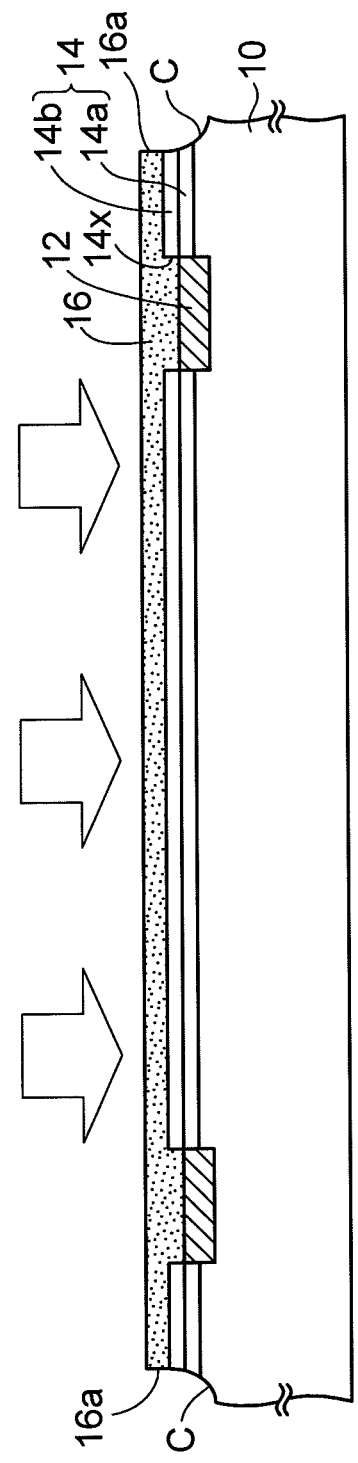
FIGS. 3A and 3B are sectional views (#3) depicting the method of manufacturing the semiconductor device according to the embodiment.

Then, as depicted in FIG. 3A, while using the dry film resist 16 as a mask, the passivation layer 14 is etched from its upper surface to the thickness direction through the opening portions 16a of the dry film resist 16 by the wet blasting method. Accordingly, a concave portion C is formed in the dicing lines D (FIG. 1) of the silicon wafer 10 respectively. The concave portions C are formed in a grid-like fashion so as to surround each chip area A.

As described later, the concave portions C formed in the silicon wafer 10 acts as an anchor that increases the adhesion of an interlayer insulating layer formed on the silicon wafer 10.

Figure 3B:
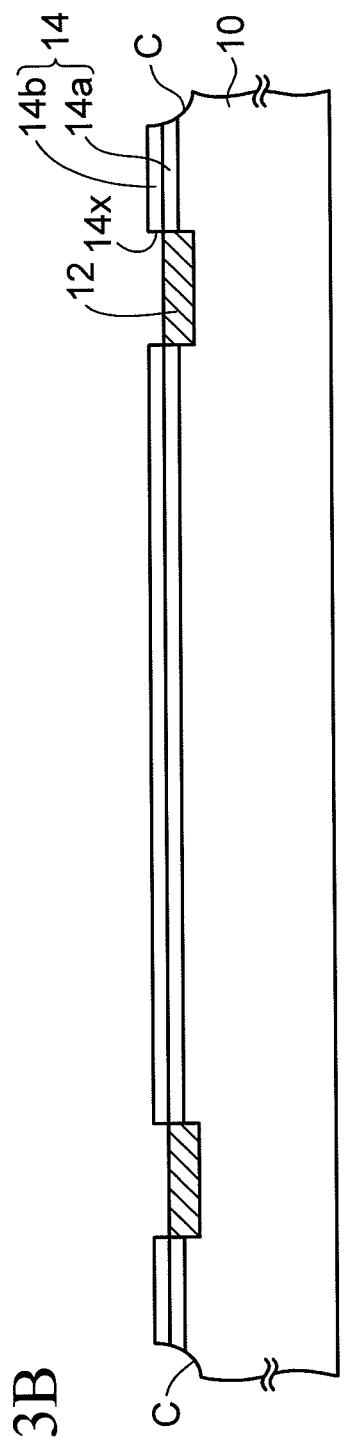

Then, as depicted in FIG. 3B, the dry film resist 16 is removed by a resist stripper. In this case, the similar mask may be formed by using a liquid resist instead of the dry film resist 16.

Figure 4A:
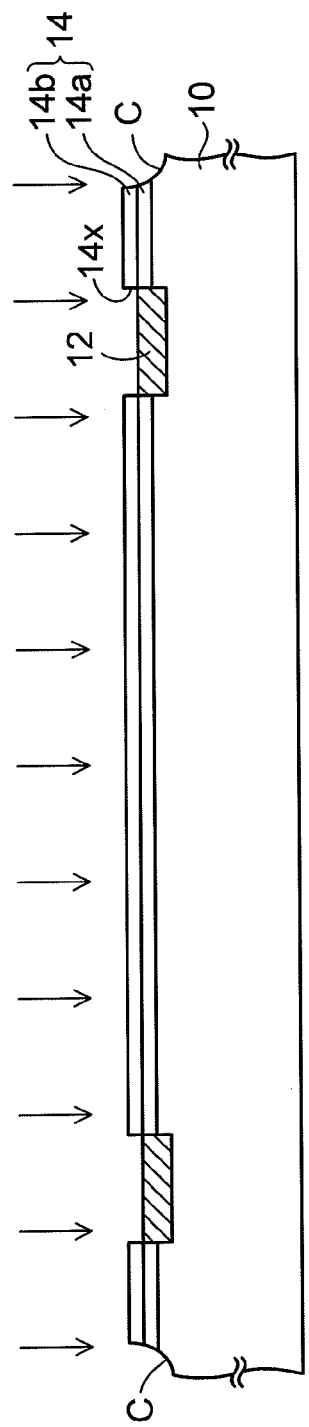
FIGS. 4A and 4B are sectional views (#4) depicting the method of manufacturing the semiconductor device according to the embodiment.

Then, as depicted in FIG. 4A, the cleaning process is applied to the upper surface side of a resultant structure depicted in FIG. 3B by an oxygen plasma. Accordingly, a surface of the passivation layer 14 is reformed (roughened), and also surfaces of the connection pads 12 are cleaned.

Figure 4B:
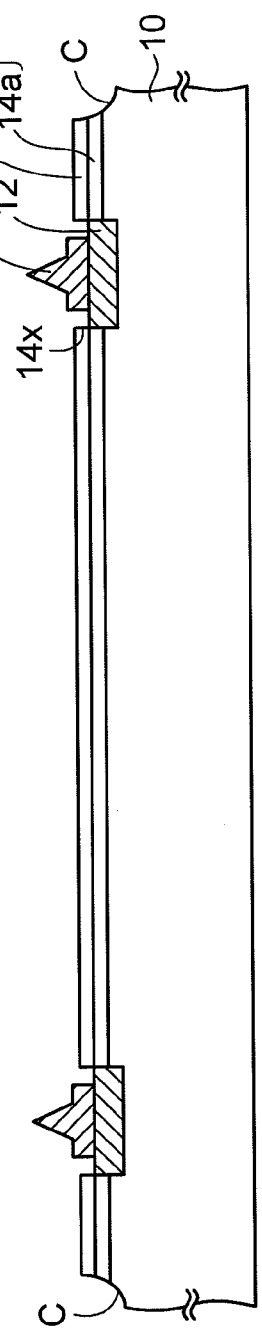

Then, as depicted in FIG. 4B, a gold (Au) wire bump 18 whose top end is sharpened is formed on the connection pads 12 respectively on the basis of the wire bonding method. The gold wire bump 18 is illustrated as the bump electrode, but copper (Cu) wire bumps having the similar shape may be formed on the basis of the wire bonding method.

Otherwise, a gold (Au) bump, or the like may be formed by the electroplating method, or a nickel (Ni) bump/a gold (Au) bump may be formed sequentially by the electroless plating method.

Then, as depicted in FIG. 5A, a resin film 20a kept in a B-stage (semi-cured state) is pasted onto the silicon wafer 10 on which the gold wire bumps 18 are provided. As the resin film 20a, a thermosetting resin such as an epoxy resin, a polyimide resins, or the like is used.

A thickness of the resin film 20a is set to a thickness (e.g., 30 μm) which is slightly thinner than a height of the gold wire bump 18. Thus, such a situation is obtained that the top end of the gold wire bump 18 is exposed from an upper surface of the resin film 20a.

Then, as depicted in FIG. 5B, the resin film 20a is pressed downward by a pressing jig (not shown) and is planarized, and then a heat treatment is applied to the resin film 20a at a temperature of about 180° C. Thus, the resin film 20a kept in a B-stage is cured, and a first interlayer insulating layer 20 is obtained.

At this time, the top ends of the gold wire bumps 18 are crushed by the planarizing process, and thus connection portions 18a are obtained. In this manner, the connection portions 18a of the gold wire bumps 18 and an upper surface of the first interlayer insulating layer 20 are planarized so as to constitute the identical surface.

Also, as described above, the concave portion C is formed on the dicing lines D (FIG. 1) on the silicon wafer 10 respectively. Therefore, the first interlayer insulating layer 20 is formed on the silicon wafer 10 with good adhesion by the anchor effect.

Here, an elastic modulus of the first interlayer insulating layer 20 formed to the lateral direction of the gold wire bump 18 is set to 3 to 20 GPa. Thus, the first interlayer insulating layer 20 is set to a film quality whose strain is relatively small to a stress. The first interlayer insulating layer 20 has an adequate mechanical strength, and the gold wire bumps 18, etc. are protected with the first interlayer insulating layer 20.

As described later, an elastic modulus of a second interlayer insulating layer, which is formed on the first interlayer insulating layer 20 and is arranged just under the external connection terminals (solder balls, or the like), is set lower than an elastic modulus of the first interlayer insulating layer 20 in order to absorb a stress applied to the external connection terminals. Thus, the second interlayer insulating layer is set to a relatively soft film quality.

An elastic modulus of the first interlayer insulating layer 20 can be adjusted by a content of inorganic fillers, e.g., silica, or the like, contained in a resin. In order to obtain the first interlayer insulating layer 20 whose elastic modulus is 3 to 20 GPa, a content of inorganic fillers is set to 40% to 90%.

Figure 6A:
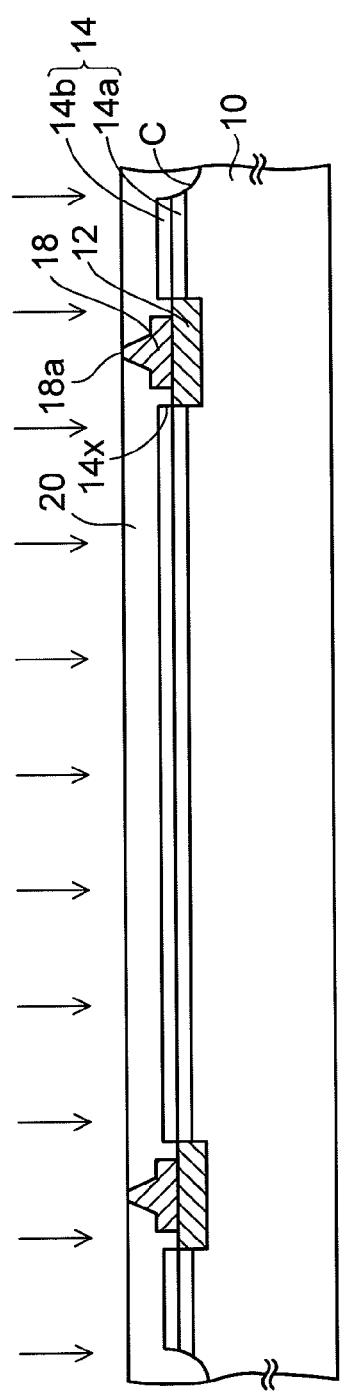
FIGS. 6A and 6B are sectional views (#6) depicting the method of manufacturing the semiconductor device according to the embodiment.

Then, as depicted in FIG. 6A, the asking process is applied to the first interlayer insulating layer 20 and the connection portions 18a of the gold wire bumps 18 by an oxygen ($O_2$) plasma into which carbon tetrafluoride ($CF_4$) is added.

Accordingly, the resin remaining in the connection portions 18a of the gold wire bumps 18 is removed, and the connection portions 18a can be exposed in a clean condition. At the same time, the surface of the first interlayer insulating layer 20 is also lightly etched and roughened, and thus the anchor is formed on the surface.

Figure 6B:
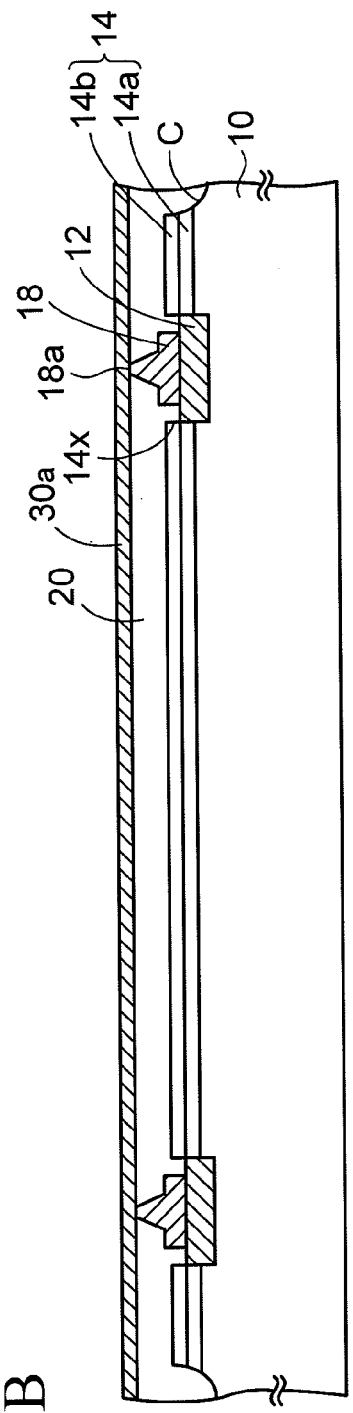

Then, as depicted in FIG. 6B, a metal layer is formed on the first interlayer insulating layer 20 by the sputter method (PVD method), and thus a seed layer 30a is obtained. Since the surface of the first interlayer insulating layer 20 is roughened, the seed layer 30a is formed on the first interlayer insulating layer 20 with good adhesion.

As a preferable example of the seed layer 30a, a laminated film which is obtained by forming a titanium (Ti) layer (thickness: 0.1 μm or more)/a copper (Cu) layer (thickness: 0.2 to 0.5 μm) sequentially from the bottom is used. Otherwise, as the seed layer 30a, a laminated film which is obtained by forming a chromium (Cr) layer (thickness: 0.035 μm or more)/a copper (Cu) layer (thickness: 0.2 to 0.5 μm) sequentially from the bottom is used.

Figure 7A:
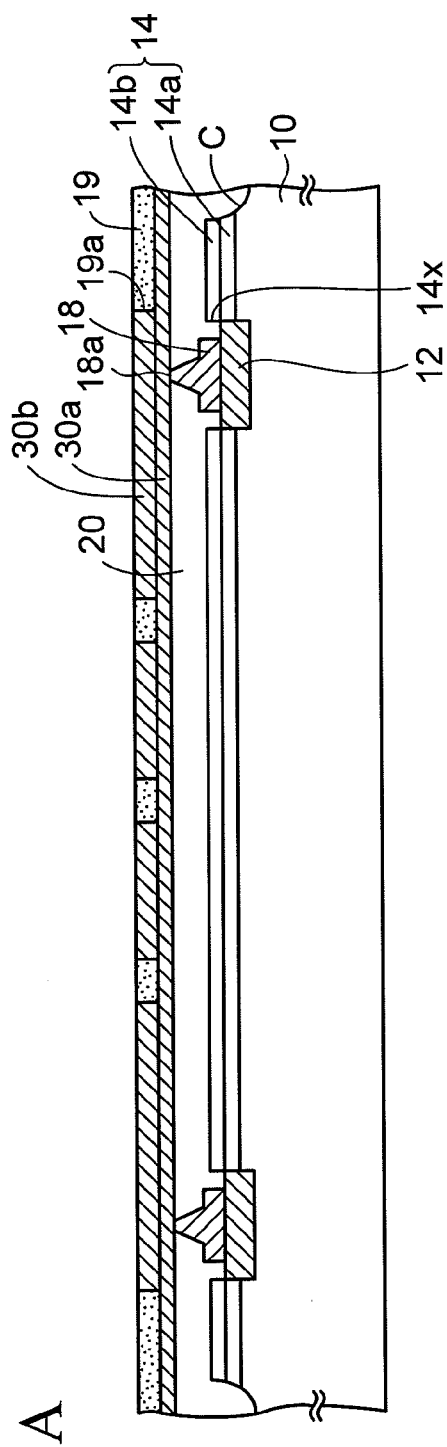
FIGS. 7A and 7B are sectional views (#7) depicting the method of manufacturing the semiconductor device according to the embodiment.

Then, as depicted in FIG. 7A, a plating resist 19 in which opening portions 19a are provided on the parts where the first wiring layer is arranged is formed on the seed layer 30a on the basis of the photolithography. Then, a metal pattern layer 30b is formed in the opening portions 19a of the plating resist 19 respectively by the electroplating that utilizes the seed layer 30a as a plating power feeding path. The metal pattern layer 30b is formed of the wiring material such as copper, or the like.

Then, the plating resist 19 is removed, and then the seed layer 30a is etched while using the metal pattern layer 30b as a mask.

Figure 7B:
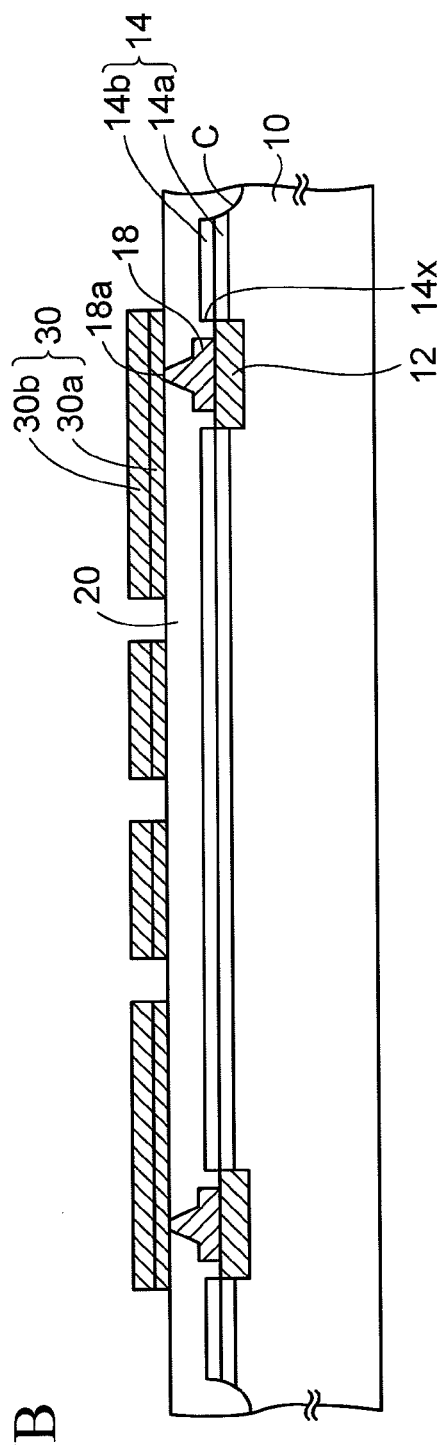

Accordingly, as depicted in FIG. 7B, first wiring layers 30 each constructed by the seed layer 30a and the metal pattern layer 30b are obtained. The first wiring layer 30 is formed to be connected electrically to the connection portion 18a of the gold wire bump 18. Then, the anchor is formed by roughening the surface of the first wiring layer 30 by means of a chemical solution in a formic acid series.

Figure 8A:
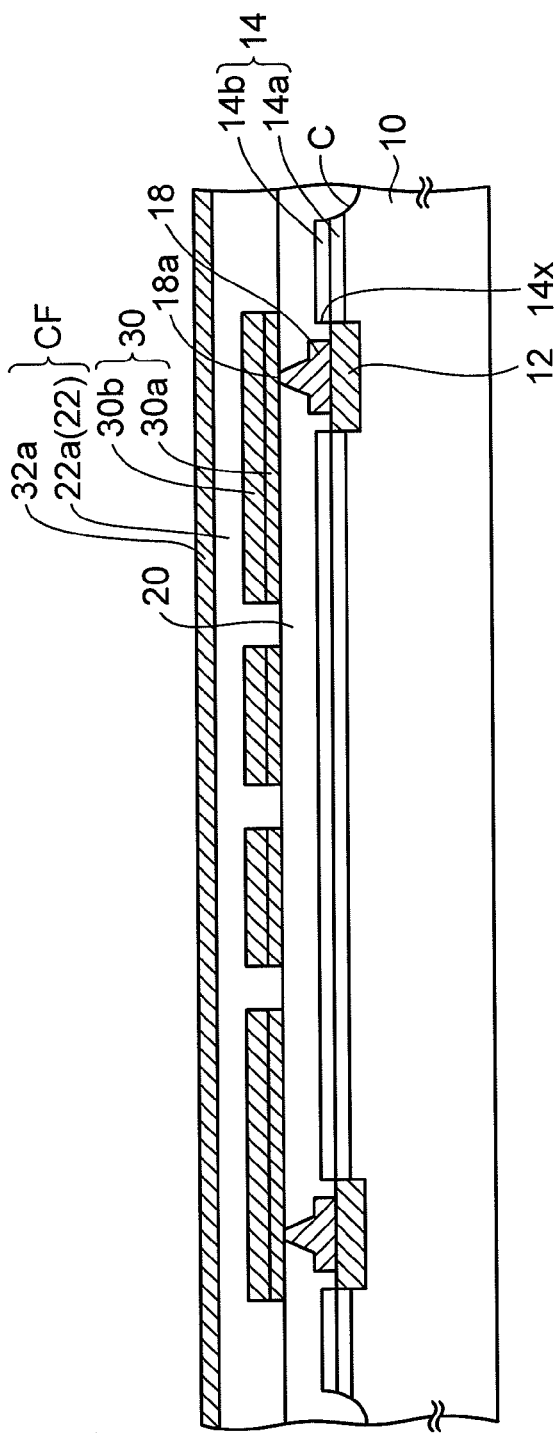
FIGS. 8A and 8B are sectional views (#8) depicting the method of manufacturing the semiconductor device according to the embodiment.

Then, as depicted in FIG. 8A, a resin film with copper foil CF having such a structure that a copper foil 32a is pasted onto a resin film 22a kept in a B-stage (semi-cured state) is prepared. A thickness of the copper foil 32a is 5 to 18 μm, and a thickness of the resin film 22a is preferably 30 to 60 μm. As the resin film 22a, a thermosetting resin such as an epoxy resin, a polyimide resin, or the like is used.

Then, a surface of the resin film 22a of the resin film with copper foil CF is pressure-bonded to the first wiring layers 30. Then, the resin film 22a kept in a B-stage is cured by applying a heat treatment at a temperature of about 180° C., and a second interlayer insulating layer 22 is obtained.

Since the surface of the first wiring layers 30 is roughened, the second interlayer insulating layer 22 is formed on the first wiring layers 30 with good adhesion.

Here, an elastic modulus of the second interlayer insulating layer 22 is set to 0.5 to 2 GPa, and the second interlayer insulating layer 22 is set to a soft film quality whose strain is relatively large to a stress. That is, an elastic modulus of the second interlayer insulating layer 22 is set lower than an elastic modulus of the first interlayer insulating layer 20. As described later, this is because it causes the second interlayer insulating layer 22 to absorb the stress applied to the external connection terminals which are mounted just over the second interlayer insulating layer 22.

An elastic modulus of the second interlayer insulating layer 22 can be adjusted by a content of inorganic fillers, e.g., silica, or the like, contained in a resin. In order to obtain the second interlayer insulating layer 22 whose elastic modulus is 0.5 to 2 GPa, a content of inorganic fillers is set to 0% to 20%. Otherwise, an elastic modulus may be adjusted by employing a resin whose skeleton is different mutually between the first interlayer insulating layer 20 and the second interlayer insulating layer 22.

Respective thicknesses of the first interlayer insulating layer 20 and the second interlayer insulating layer 22 can be set arbitrarily. In this case, it is preferable that, from the viewpoint that it cases the insulating layer to absorb sufficiently the stress applied to the external connection terminals, a thickness of the second interlayer insulating layer 22 whose elastic modulus is low should be set relatively thicker. As a preferable example, the second interlayer insulating layer 22 is set to have about one to two times the thickness of the first interlayer insulating layer 20. For example, in case a thickness of the first interlayer insulating layer 20 is 30 μm, a thickness of the second interlayer insulating layer 22 is set to 30 to 60 μm.

In the present embodiment, the resin film with copper foil CF is pasted onto the first wiring layers 30. In this case, various laminated films in each of which a metal layer is laminated on an insulating layer can be used.

Figure 8B:
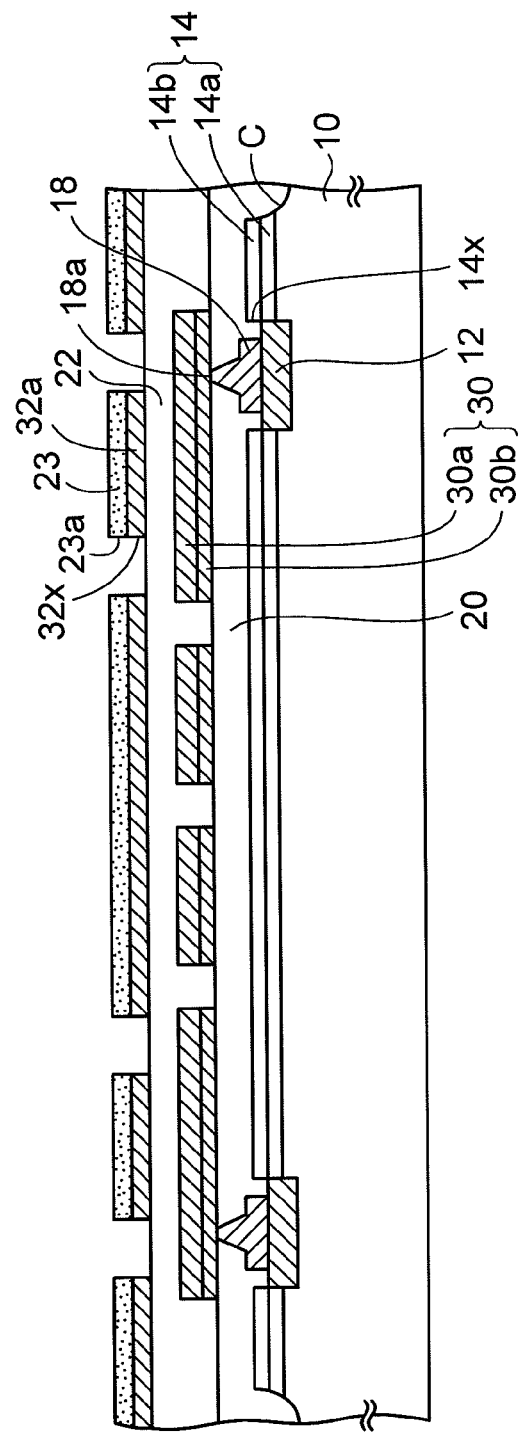

Then, as depicted in FIG. 8B, a dry film resist 23 in which opening portions 23a are provided on parts corresponding to the connection portions of the first wiring layers 30 is formed. Then, the copper foil 32a is wet-etched through the opening portions 23a of the dry film resist 23 by a copper etchant such as a copper (II) chloride aqueous solution, or the like while using the dry film resist 23 as a mask, and thus opening portions 32x are formed in the copper foil 32a.

Figure 9A:
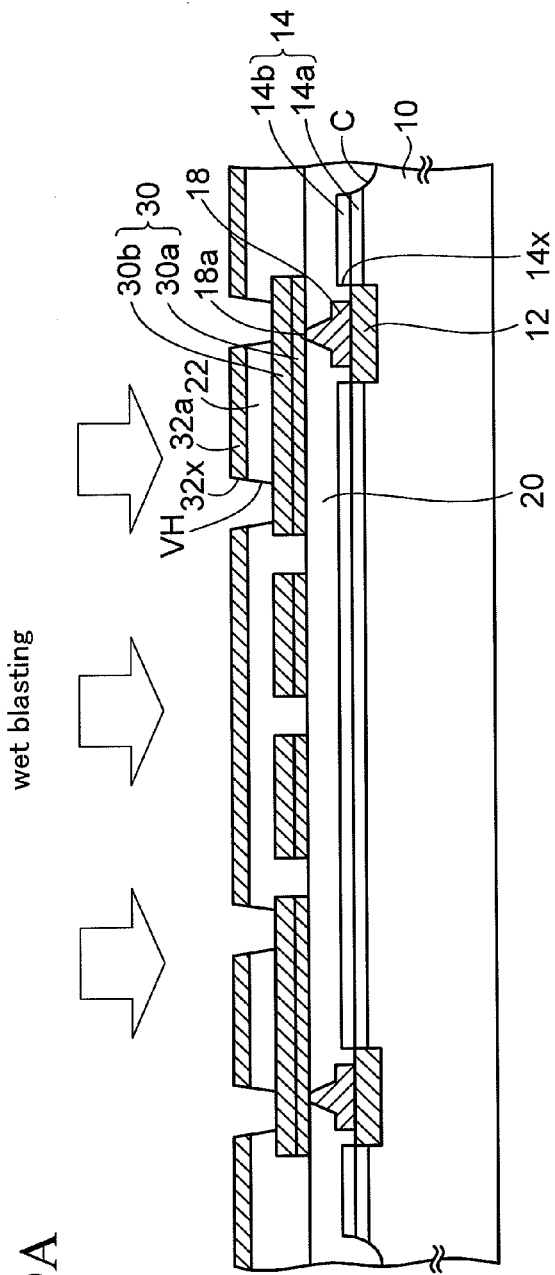
FIGS. 9A and 9B are sectional views (#9) depicting the method of manufacturing the semiconductor device according to the embodiment.

Then, as depicted in FIG. 9A, the second interlayer insulating layer 22 exposed from the opening portions 32x of the copper foil 32a is etched by the wet blasting method in a state that the dry film resist 23 is still left (FIG. 8B). Thus, via holes VH each reaching the connection portion of the first wiring layer 30 are formed. A diameter of the via hole VH is set to 50 to 80 μm, for example. At this time, the dry film resist 23 (FIG. 8B) is etched simultaneously by the wet blasting method, and is removed.

The wet blasting method indicates such a processing method that the slurry which is obtained by mixing grains such as alumina abrasive grains, or the like and a liquid such as water, or the like is sprayed at a high speed from a spray nozzle by using a force of compressed air, so that the work piece is etched physically by the grains contained in the slurry.

Also, in the wet blasting method, an etching rate of the first wiring layer 30 (copper) is considerably low. Therefore, the first wiring layer 30 acts as a stopper upon etching the second interlayer insulating layer 22.

Also, a thickness of the dry film resist 23 (FIG. 8B) is set such that the dry film resist 23 completely disappears at the halfway time in etching of the second interlayer insulating layer 22. After the dry film resist 23 disappeared, the copper foil 32a functions as a mask.

Accordingly, the surface of the copper foil 32a serving as the second wiring layer later is roughened by the wet blasting method, and the anchor is simultaneously formed.

Also, unlike the present embodiment, in the case that the via holes VH are formed in the second interlayer insulating layer 22 by the laser, a resin smear is produced in the via holes VH. Therefore, the desmear process must be executed by the wet process such as the permanganic acid method, or the like.

However, in the case that the wet blasting method is used, a resin smear is hardly produced. Thus, the clean via holes VH can be obtained easily by the water rinsing after the via holes VH are formed in the second interlayer insulating layer 22. In this manner, in the present embodiment, the desmear process that affects the loads to the environment can be omitted.

Figure 9B:
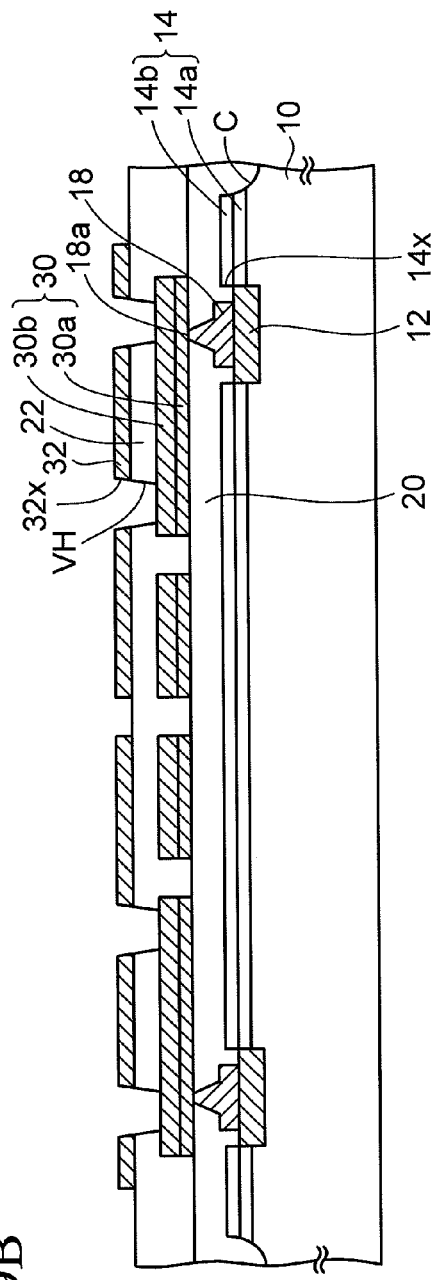

Then, as depicted in FIG. 9B, an etching resist (not shown) is patterned on the copper foil 32a, and then the copper foil 32a is etched by using the etching resist as a mask. Thus, second wiring layers 32 are obtained.

At this point of time, a via conductor is not formed in the via holes VH respectively. Hence, the first wiring layer 30 and the second wiring layer 32 are in a state that these layers are not electrically connected.

Therefore, a via conductor is formed in the via hole VH such that the first wiring layer 30 and the second wiring layer 32 are electrically connected via the via conductor.

In the present embodiment, as the method of forming the via conductor, the approach such as the sputter method, the electroplating method, the electroless plating method, or the like, which brings about an increase in cost, is not employed.

Figure 10:
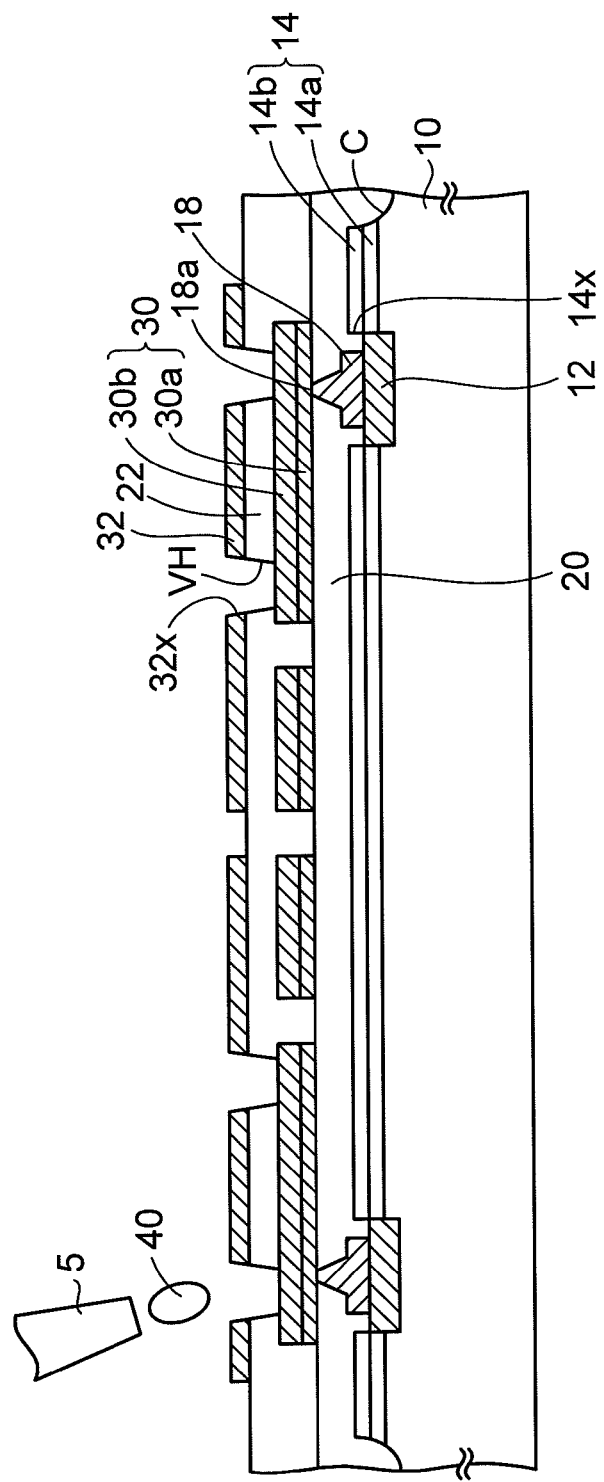
FIG. 10 is a sectional view (#10) depicting the method of manufacturing the semiconductor device according to the embodiment.

More particularly, as depicted in FIG. 10, a conductive paste 40 such as a silver paste, or the like is coated to the inside of the via hole VH from a nozzle 5 of a dispenser equipment (not shown) by the dispensing method, and then the conductive paste 40 is subjected to a heat treatment and is cured. Thus, the first wiring layer 30 and the second wiring layer 32 are electrically connected. The conductive paste 40 is obtained by dispersing conductive particles such as silver grains, or the like into the thermosetting resin as the binder.

As depicted in FIG. 11A, in the case that the conductive paste 40 is formed by the dispensing method, such conductive paste 40 is filled in the via hole VH and is formed to cover the second wiring layer 32 located in vicinity of the via hole VH.

Otherwise, the conductive paste 40 may be formed in the via hole VH by the ink jetting method instead of the dispensing method. As depicted in FIG. 11B, in the case that the ink jetting method is used, the conductive paste 40 is not embedded in the via hole VH, and a concave portion is left in the via hole VH.

That is, the conductive paste 40 is formed along the bottom surface and the side surface of the via hole VH as the so-called conformal via. Also in the case that the ink jetting method is used, the conductive paste 40 is formed to cover the second wiring layer 32 located in vicinity of the via hole VH.

Also, as other method of forming the via conductor, a photosensitive conductive paste containing a photosensitizing agent may be used. In this case, the photosensitive conductive paste is coated on the whole upper surface of a silicon wafer 10 by the spin coater, or the like, and then is exposed/developed on the basis of the photolithography. Thus, the conductive paste 40 is formed selectively in the via hole VH so that the first wiring layer 30 and the second wiring layer 32 are electrically connected. As the photosensitive conductive paste, there are a photosensitive silver paste, and the like. In the case that the photosensitive conductive paste is used, the conductive paste 40 is formed as the conformal via like the case where the conductive paste 40 is formed by the ink jetting method.

Otherwise, besides the conductive paste 40, the solder may be filled in the via hole VH, and the first wiring layer 30 and the second wiring layer 32 may be electrically connected via the solder. In this case, a solder ball is mounted in the via hole VH, and the solder is filled in the via hole VH by the reflow heating. Alternatively, a solder paste (cream solder) may be coated selectively to the via hole VH.

According to the above approach, without the use of either the sputter method that brings about an increase in cost or the plating method that affects the heavy loads to the environment and needs the complicated steps, the via conductor can be formed easily at a low cost by forming the conductive paste or the solder in the via hole VH.

In this manner, the interlayer connecting structure in which the second wiring layer 32 is connected to the first wiring layer 30 via the via hole VH formed in the second interlayer insulating layer 22 is obtained. Thus, the rewiring (the first and second wiring layers 30, 32) having the multilayer structure is connected to the gold wire bump 18 which is provided to the silicon wafer 10. A pitch of the connection pads 12 of the silicon wafer 10 is pitch-converted by the rewiring (the first and second wiring layers 30, 32) so as to correspond to a pitch of the connection electrodes of the mounting substrate.

Here, the step of forming the second wiring layers 32 by patterning the copper foil 32a is executed after the via holes VH are formed by the wet blasting method. But this step may be executed after the conductive paste 40 is formed in the via holes VH (after FIGS. 11A and 11B).

Figure 12:
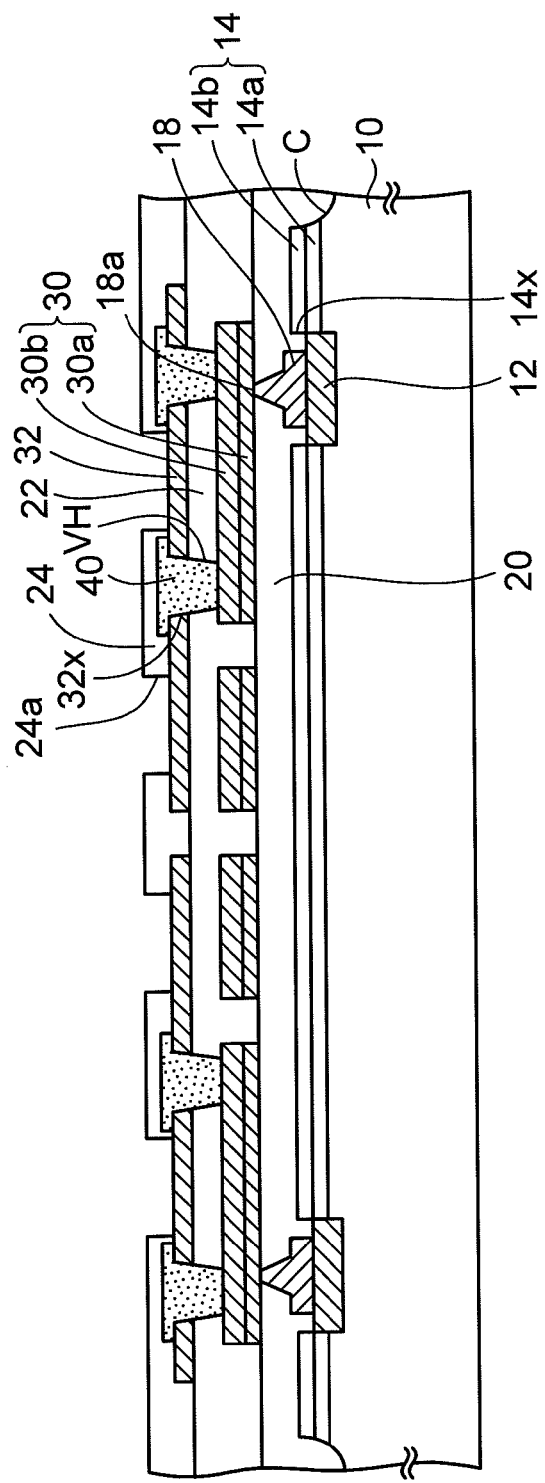
FIG. 12 is a sectional view (#12) depicting the method of manufacturing the semiconductor device according to the embodiment.

After this, as depicted in FIG. 12, a solder resist 24 in which an opening portion 24a is provided on the connection portions of the second wiring layers 32 respectively is formed. Since the surfaces of the second wiring layers 32 are roughened, the solder resist 24 is formed on the second wiring layers 32 with good adhesion. Then, the ashing process is applied to the surface of the solder resist 24 by using an oxygen plasma, so that the surface of the solder resist 24 is reformed to hydrophilicity and thus a wettability is improved.

Then, as depicted in FIG. 13, the solder ball is mounted on the opening portion 24a of the solder resist 24, and then the reflow heating is applied. Thus, an external connection terminal 34 connected to the connection portion of the second wiring layer 32 is formed. As the solder ball, a ball which is constructed by forming a solder layer on an outer surface of a resin ball may be used.

Subsequently, as also depicted in FIG. 13, as the need arises, a thickness of the silicon wafer 10 may be reduced up to about 50 to 300 μm by grinding the back surface of the silicon wafer 10 by means of the grinder. Then, the silicon wafer 10 is cut along the dicing lines D (FIG. 1). Accordingly, as depicted in FIG. 14, the silicon wafer 10 is divided into individual pieces as silicon substrates 10a (semiconductor substrates), thus an individual semiconductor device 1 including a CSP structure is obtained.

Here, in the present embodiment, the two-layered multilayer wiring (the first and second wiring layers 30, 32) is illustrated. In this case, the multilayer wiring can be formed in any number of lamination layers by repeating the above steps in FIG. 8A to FIGS. 11A and 11B.

As explained above, in the method of manufacturing the semiconductor device of the present embodiment, first, the gold wire bump 18 is formed on the connection pads 12 of the silicon wafer 10 in which the circuit elements are formed respectively, and then the first interlayer insulating layer 20 is formed such that the connection portions 18a as the top parts of the gold wire bumps 18 are exposed.

Then, the first wiring layer 30 connected to the gold wire bumps 18 is formed on the first interlayer insulating layer 20. Then, the resin film with copper foil CF is pressure-bonded to the first wiring layers 30, and the resin film 22a is utilized as the second interlayer insulating layer 22. An elastic modulus of the second interlayer insulating layer 22 is set lower than that of the first interlayer insulating layer 20, and the second interlayer insulating layer 22 functions as a stress absorbing layer which absorbs a stress applied to the external connection terminals 34.

Then, the dry film resist 23 in which the opening portion 23a are provided in the parts corresponding to the connection portions of the first wiring layers 30 is formed on the copper foil 32a. Then, the opening portions 32x are formed by etching the copper foil 32a.

Then, in this state, the second interlayer insulating layer 22 is etched through the opening portions 32x of the copper foil 32a by the wet blasting method, and thus the via holes VH each reaching the first wiring layer 30 are formed.

Then, the first wiring layer 30 and the copper foil 32a are electrically connected by forming the via conductor made of the conductive paste 40 or the solder in the via holes VH respectively. The copper foil 32a is patterned in a predetermined stage, and becomes the second wiring layers 32. Then, the external connection terminal 34 is provided onto the second wiring layers 32 respectively.

By using of such method, there is no need to use the following technologies when the second wiring layers 32 each connected to the first wiring layer 30 via the via hole VH are formed. That is, there is no need to use the technologies of 1) formation of the photo via using a photosensitive polyimide, 2) film formation of the metal layer (the seed layer, or the like) by the sputter method, 3) formation of the via hole by the laser, 4) desmear process applied to the via hole by a strong alkaline liquid in a permanganic acid series, and 5) formation of wiring by the wet plating (electroless Cu plating/electrolytic Cu plating).

Accordingly, the number of steps needed for the manufacture can be greatly reduced, and thus a manufacturing cost can be reduced. Also, the desmear process or the wet plating process is not needed. Therefore, a harmful waste liquid can be reduced, and reduction of the loads affected to the environment can be achieved.

In this manner, in the present embodiment, the rewiring (the first and second wiring layers 30, 32) having the multi-layer structure including the second interlayer insulating layer 22 which absorbs a stress applied to the external connection terminals can be formed on the silicon wafer 10 by the simple method that can attain a cost reduction. Accordingly, the present embodiment can deal easily with the manufacture of the semiconductor device such as ASIC, Logic, or the like, that the multi-pin type is required.

As depicted in FIG. 14, in the semiconductor device 1 of the present embodiment, the element forming areas T (FIG. 1) in which the circuit elements such as the transistor, etc. are formed are provided in the silicon substrate 10a (semiconductor substrate). The connection pads 12 are provided on the silicon substrate 10a, and the connection pads 12 are connected to the element forming areas T (FIG. 1) via the multilayer wiring (not shown).

The gold wire bump 18 is formed on the connection pads 12 respectively, and the first interlayer insulating layer 20 is formed to the lateral direction of the gold wire bumps 18. The connection portions 18a of the gold wire bumps 18 are arranged at the identical height with the upper surface of the first interlayer insulating layer 20, and they are planarized.

Also, the first wiring layers 30 each connected to the connection portion 18a of the gold wire bump 18 are formed on the first interlayer insulating layer 20. The second interlayer insulating layer 22 is formed on the first wiring layers 30, and the via holes VH each reaching the connection portion of the first wiring layer 30 is formed in the second interlayer insulating layer 22.

The second wiring layer 32 which extends outward from the outer periphery of the via hole VH is formed on the second interlayer insulating layer 22. The second wiring layer 32 is formed by patterning the copper foil 32a.

Further, the conductive paste 40 is filled in the via holes VH respectively. The conductive paste 40 is formed from the inside of the via hole VH to its outer vicinity area, and is formed to cover the second wiring layer 32 located in vicinity of the via hole VH.

According to this, the first wiring layer 30 is connected electrically to the second wiring layer 32 via the conductive paste 40 (via conductor). The first wiring layer 30 and the second wiring layer 32 may be connected by using the solder instead of the conductive paste 40.

As described above, there is no necessity that the conductive paste 40 should always be formed to embed the via hole VH, and the conductive paste 40 may be formed along the bottom surface and the side surface of the via hole VH as the conformal via.

The semiconductor device 1 of the present embodiment is manufactured by the above-mentioned manufacturing method. As a consequence, the semiconductor device 1 has such a structure that the second wiring layer 32 is not arranged on the conductive paste 40 (via conductor) in the via hole VH.

Also, the solder resist 24 in which the opening portion 24a is provided on the connection portions of the second wiring layers 32 respectively is formed. Then, the external connection terminal 34 connected to the second wiring layer 32 is provided on the opening portions 24a of the solder resist 24 respectively.

A pitch of the connection pads 12 of the silicon substrate 10a is pitch-converted by the rewiring (the first and second wiring layers 30, 32) so as to correspond to a pitch of the connection electrodes of the mounting substrate.

An elastic modulus of the second interlayer insulating layer 22 is set lower than that of the first interlayer insulating layer 20. Thus, a stress applied to the external connection terminals 34 can be absorbed by the second interlayer insulating layer 22.

Figure 15:
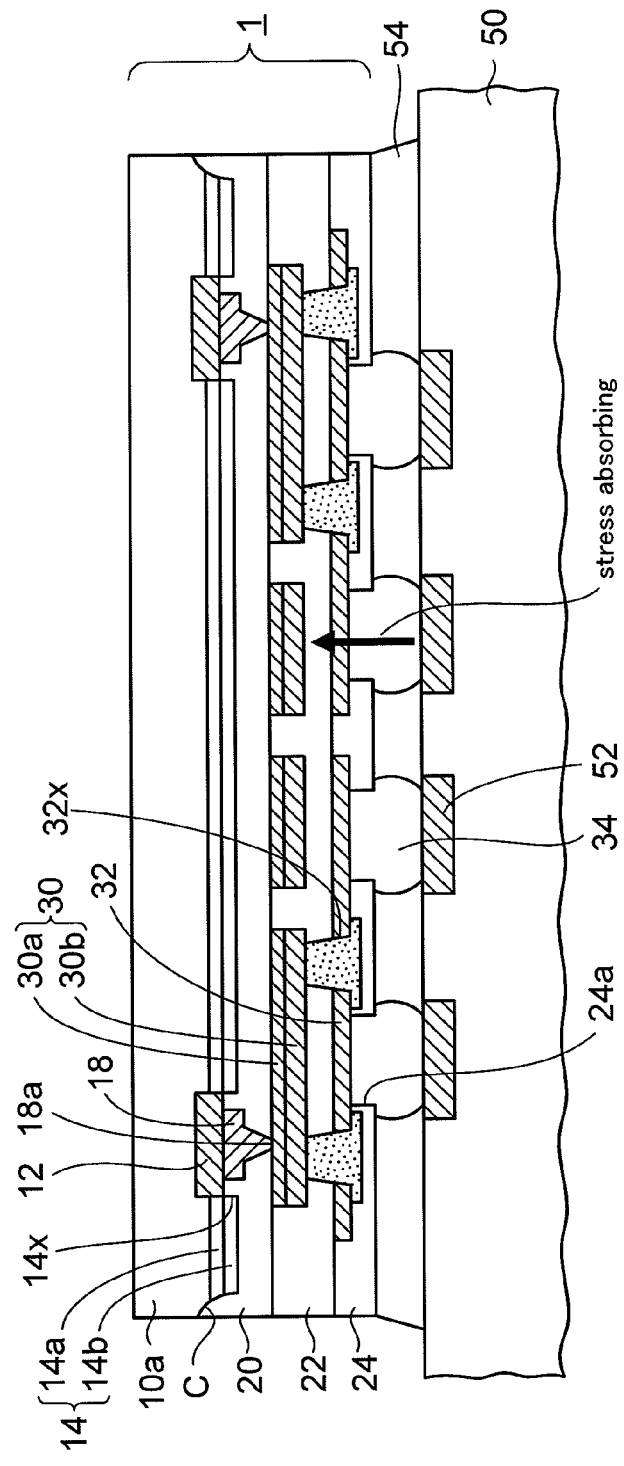
FIG. 15 is a sectional view depicting a state that the semiconductor device according to the embodiment is mounted on a mounting substrate.

As depicted in FIG. 15, the external connection terminals 34 of the semiconductor device 1 are connected to connection electrodes 52 of a mounting substrate 50 (mother board, or the like) by the reflow soldering, or the like. Then, an underfill resin 54 is filled into a clearance located under the semiconductor device 1. There is no need that the underfill resin 54 should always be filled, and in some cases the underfill resin 54 may be omitted.

When the semiconductor device 1 is mounted on the mounting substrate, a thermal stress is caused due to a difference of a coefficient of thermal expansion between the semiconductor device 1 and the mounting substrate at a time of heating process, or the like, and a stress is readily concentrated in the external connection terminals 34 of the semiconductor device 1. As a result, in some cases the conduction failure may be caused because either the cracks are generated around the external connection terminals 34 of the semiconductor device 1 or the boundary separations are generated.

In the present embodiment, the second interlayer insulating layer 22 whose elastic modulus is set lower than that of the first interlayer insulating layer 20 and which is set to soft film quality is present just under (in FIG. 15, just over) the external connection terminals 34 of the semiconductor device 1. Accordingly, the second interlayer insulating layer 22 functions as the stress absorbing layer for absorbing the stress which is concentrated in the external connection terminals 34.

Accordingly, the stress concentration to the external connection terminals 34 of the semiconductor device 1 is eased. As a result, such a drawback can be solved that either the cracks are generated around the external connection terminals 34 of the semiconductor device 1 or the boundary separations are generated.

Also, the first interlayer insulating layer 20 whose elastic modulus is higher than that of the second interlayer insulating layer 22 to have an adequate hardness is present just under (in FIG. 15, right over) the second interlayer insulating layer 22. Therefore, the thin type semiconductor device 1 having enough mechanical strength is constructed.

As a result, the highly reliable electrical connection can be obtained between the semiconductor device 1 and the mounting substrate 50, and the highly reliable electronic module can be constructed.

In the above present embodiment, the example in which the interlayer insulating layers are laminated with two layers is illustrated. In the case that the number of laminated layers is increased, similarly an elastic modulus of the interlayer insulating layer located just under the external connection terminals 34 may be set lower than that of other interlayer insulating layer.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
   a semiconductor substrate including:
   a connection pad;
   a passivation layer having an opening portion exposing the connection pad; and
   a bump electrode formed on the connection pad;
   a first insulating layer formed on the passivation layer, and arranged to a lateral direction of the bump electrode;
   a second insulating layer formed on the first wiring layer;
   a via hole formed in the second insulating layer, and reaching the first wiring layer;
   a second wiring layer formed on the second insulating layer, and connected to the first wiring layer through a via conductor formed in the via hole, wherein the via conductor which connects the first wiring layer and the second wiring layer is formed of a conductive paste or a solder;
   a solder resist in which an opening portion is formed on a connection part of the second wiring layer; and
   an external connection terminal connected to the connection part of the second wiring layer;
   wherein an elastic modulus of the second insulating layer is set lower than an elastic modulus of the first insulating layer.

2. A semiconductor device according to claim 1, wherein the second wiring layer is formed to extend outward from an outer periphery of the via hole.

3. A semiconductor device according to claim 2, wherein the via conductor is filled in the via hole, and is formed to cover the second wiring layer located in vicinity of the via hole.

4. A semiconductor device according to claim 2, wherein the second wiring layer is formed of a copper foil.

5. A semiconductor device according to claim 1, wherein a concave portion is formed in a periphery part of the semiconductor substrate.

6. A semiconductor device according to claim 5, wherein the bump electrode is formed of a wire bump, and the first insulating layer is formed on the passivation layer such that the first insulating layer covers the wire bump except a connection part of the wire bump, and fills the concave portion.

7. A semiconductor device according to claim 1, wherein the elastic modulus of the second insulating layer is set to 0.5 to 2 GPa, and the elastic modulus of the first insulating layer is set to 3 to 20 GPa.

* * * * *